US008225152B2

(12) United States Patent
Sutton

(10) Patent No.: US 8,225,152 B2
(45) Date of Patent: *Jul. 17, 2012

(54) METHOD AND APPARATUS FOR GENERATING ELECTRONIC TEST AND DATA STRUCTURE

(75) Inventor: Christopher K Sutton, Everett, WA (US)

(73) Assignee: Agilent Technologies, Inc., Santa Clara, CA (US)

( * ) Notice: Subject to any disclaimer, the term of this patent is extended or adjusted under 35 U.S.C. 154(b) by 2432 days.

This patent is subject to a terminal disclaimer.

(21) Appl. No.: 10/141,719

(22) Filed: May 9, 2002

(65) Prior Publication Data

US 2003/0212938 A1 Nov. 13, 2003

(51) Int. Cl.
*G01R 31/28* (2006.01)

(52) U.S. Cl. ....................................................... 714/724
(58) Field of Classification Search .................... 714/724
See application file for complete search history.

(56) References Cited

U.S. PATENT DOCUMENTS

| 5,206,582 | A | * | 4/1993 | Ekstedt et al. | 324/73.1 |
|---|---|---|---|---|---|
| 6,029,257 | A | * | 2/2000 | Palmer | 714/40 |
| 6,128,759 | A | | 10/2000 | Hansen | |
| 6,211,513 | B1 | * | 4/2001 | Brown et al. | 250/221 |
| 6,463,552 | B1 | * | 10/2002 | Jibbe | 714/33 |
| 6,662,217 | B1 | * | 12/2003 | Godfrey et al. | 709/219 |
| 6,839,650 | B2 | * | 1/2005 | Sutton et al. | 702/123 |
| 2003/0097233 | A1 | | 5/2003 | Sutton et al. | |

FOREIGN PATENT DOCUMENTS

| EP | 1 314 989 A2 | 11/2002 |
|---|---|---|
| EP | 1 314 989 A3 | 11/2002 |
| WO | WO 99/47937 A2 | 3/1999 |
| WO | WO 99/47937 A3 | 3/1999 |

OTHER PUBLICATIONS

Microsoft Computer Dictionary Fifth Edition.*
Whatis.com Encyclopedia of Technology Terms. Sep. 2001.*
National Instruments, "TestStand—A Complete Test Executive Environment," National Instruments, p. 55-60 (Mar. 2000).
Motti Klinger, "Reusable Test Executive and Test Programs Methodology and Implementation Comparison Between HP VEE and Labview", XP-002259312, ,1999 IEEE, 0-7803-5432-X/99, pp. 305-312.
Kirk D. Thompson,"COM-Based Test Foundation Framework", 0-7803-5432-X/99, 1999 IEEE, pp. 19-25.
Kirk G. Fertitta, et al, "The Role of Activex and COM in ATE", 0-7803-5432-X/99, 1999 IEEE, pp. 35-51.

* cited by examiner

*Primary Examiner* — Steve Nguyen

(57) ABSTRACT

A hierarchical test executive system comprising and including Procedure, Test, Measurement and Datapoint levels. A Procedure is an ordered list of Tests; a Test is a group of Measurements in a Procedure that share the same test algorithm, and thus the same software code; a Measurement is a configuration or setup for a Test, and provides parameters to a Test; and a Datapoint is a subset of a Measurement containing additional parameters that select a result when one Measurement generates multiple results. When initiated, the test executive system presents a list of models and the user selects a model to be tested. The program then uploads the test software corresponding to the selected model and presents a list and descriptions of Procedures to the user. The user selects one of the Procedures, and the program retrieves the selected procedure from the test software and expands it into Tests, Measurements and Datapoints as determined by the Procedure. The test executive system then loops through the Tests, Measurements and Datapoints, generating the results and a corresponding data structure on the fly.

24 Claims, 7 Drawing Sheets

METHOD AND APPARATUS FOR GENERATING ELECTRONIC TEST AND DATA STRUCTURE

BACKGROUND OF THE INVENTION

Test systems are used to test complex electronic product devices over many phases of the product's life cycle which include test development, qualification testing, and manufacturing testing. These complex electronic product devices are tested for many independent parameters and are part of many different model families. Due to the large number of different products, different parameters to be tested and product model families, a test engineer is tasked with constantly modifying the test system without errantly causing the test system to become inoperative due to misplaced modifications or code.

Prior art test programs are difficult to design tests for because a test engineer has to focus on the whole test when designing or modifying the individual parts of a test program, such as individual tests, tests lists or test algorithms. In prior art systems, test procedures are incorporated into the test algorithms, thereby making the test algorithm susceptible to errantly entered commands while modifying a test procedure. Further, prior art programs are difficult to design tests for because they use data tables. This requires a test engineer to create and enter all the parameters to be used in the test program in this data table. This also requires test engineers to perform a tedious and lengthy procedure for structuring the data, in which the parameters for each datapoint must be entered into the table. The tediousness and abstractness of the data entering process and requirement for intensive programmer input in the data table method can lead to errors.

In addition, test sequencing can be rigid and inflexible when using test systems designed with large bulky test algorithms incorporated into structured programs. This increases the time a test engineer spends on rewriting or debugging the test system algorithms due to inerrant test procedure modifications or entries. In addition, portions of a test cannot be easily reused by a test engineer because they are written into a larger structured program. This inability to reuse test system code increases time rewriting or reentering new non-reusable test system code.

SUMMARY OF THE INVENTION

The present invention advances the art and helps to overcome the aforementioned problems by providing a test executive system that creates tests from reusable parts and generates custom data on the fly as the test is being run.

The test executive system according to the invention, in general, includes a method and a software program that function as follows: the system presents to the user a list of models for which test software is available, and the user selects a model to be tested; the program then uploads test software corresponding to the selected model; the program then asks the uploaded software for a list and description of procedures and presents these to the user; the program pauses while the user selects one of the procedures; when the procedure is selected, the program retrieves the selected procedure from the software and, following a prescription in the procedure, expands a procedure software object into tests, measurements and datapoints, each of which will be discussed in detail below. The test executive system then loops through the tests, measurements and datapoints, generating a data structure on the fly.

The invention provides a method of operating a test executive system for electronically testing a device under test (DUT) that is separate and distinct from the test executive system, the method comprising: electronically storing a plurality of tests and a procedure, each test comprising software code defining a test algorithm and the procedure comprising data describing an ordered list of the tests; expanding the procedure by combining predetermined ones of the tests as determined by the ordered list; executing the procedure on the DUT and generating a data structure comprising the results of the predetermined tests. Preferably, the procedure includes a list of one or more measurements, each of the measurements comprise a configuration for a specified test, and the expanding comprises adding the measurements in the list to a collection of measurements associated with the specified test. Preferably, procedures, tests, and measurements are implemented as software objects. Preferably, each of the tests comprise a test object, the procedure comprises a procedure object, and each of the measurements comprises a measurement object, and the measurement objects pass test parameters to the test object. Preferably, the procedure includes a list of datapoints, each of the datapoints associated with one of a plurality of results for a specified measurement, and the expanding comprises adding the datapoints to a collection of datapoints associated with the specified measurement. Preferably, the expanding comprises: adding the datapoint object to a collection of datapoint objects associated with a specified measurement as determined by the procedure; adding the measurement object to a collection of measurement objects associated with a specified test as determined by the procedure, and adding the predetermined test objects to the procedure object. Preferably, the expanding further comprises creating the software objects. Preferably, the executing comprises looping through the tests, measurements and datapoints while generating the data table comprising the results of the tests, measurements, and datapoints. Preferably, each of the tests and the procedure comprises a software object, and the expanding comprises adding the predetermined test objects to the procedure object. Preferably, the method further comprises displaying a list of models available to be tested, receiving a selection of one of the models, and the storing comprises storing tests and a procedure associated with the selected model. Preferably, the storing comprises loading a DLL file associated with the selected model. Preferably, the method further comprises retrieving a list of available procedures from the DLL file, displaying the list, and receiving a selection of the procedure. Preferably, the method further comprises displaying a list of available procedures and receiving a selection of the procedure.

The invention also provides a test executive system for testing a device under test (DUT) that is separate and distinct from the test executive system, the system comprising: an electronic memory storing a plurality of tests and a procedure, each test comprising software code defining a test algorithm and the procedure comprising data describing an ordered list of the tests; a processor communicating with the memory for expanding the procedure by combining predetermined ones of the tests as determined by the ordered list and executing the procedure on the DUT to generate test results; and a graphical user interface (GUI) communicating with the processor and including a data structure comprising the test results. Preferably, the procedure includes a list of one or more measurements, each of the measurements comprise a configuration for a specified test, and the processor adds the measurements in the list to a collection of measurements associated with the specified test when expanding the procedure. Preferably, the procedure includes a list of datapoints, each of the datapoints associated with one of a plurality of results for a specified measurement, and the processor adds the datapoints to a collection of datapoints associated with the specified measurement when expanding the procedure. Preferably, the GUI further comprises a menu including a list of models available to be tested. Preferably, the data structure is selected from the group consisting of a table and a hierarchical tree.

The invention also provides a product that provides a test executive system for controlling tests upon a device under test (DUT) that is distinct and separate from the test executive system, the product comprising: instructions for directing a processing unit to: load into a memory a plurality of tests and a procedure, each test comprising software code defining a test algorithm and the procedure comprising data describing an ordered list of the tests; expand the procedure by combining predetermined ones of the tests as determined by the ordered list; execute the procedure on the DUT and generate a data structure comprising the results of the predetermined tests; and a media readable by the processing unit that stores the instructions. Preferably, the procedure includes a list of one or more measurements, each of the measurements comprise a configuration for a specified test, and the instructions to expand include instructions to add the measurements in the list to a collection of measurements associated with the specified test. Preferably, the procedure includes a list of datapoints, each of the datapoints associated with one of a plurality of results for a specified measurement, and the instructions to expand include instructions to add the datapoints to a collection of datapoints associated with the specified measurement. Preferably, each of the tests comprise a test software object, the procedure comprises a procedure software object, each of the measurements comprises a measurement object, and each of the datapoints comprises a datapoint software object, and the instructions to expand comprise instructions to: add the datapoint object to a collection of datapoint objects associated with a specified measurement as determined by the procedure; add the measurement object to a collection of measurement objects associated with a specified test as determined by the procedure; and add the predetermined test objects to the procedure object.

The invention enables the test engineer to break down a complex test into manageable units that can be separately considered and the interaction of which can be easily understood. The invention makes data structure generation more efficient because the test objects consistently generate measurements and data points in an organized and logical fashion. The above and other advantages of the present invention may be better understood from a reading of the following description of the preferred exemplary embodiments of the invention taken in conjunction with the drawings in which:

DETAILED DESCRIPTION OF THE PREFERRED EMBODIMENT

Overview

The present invention provides a method and apparatus for generating custom data structures in an electronic test system.

Figure 1:
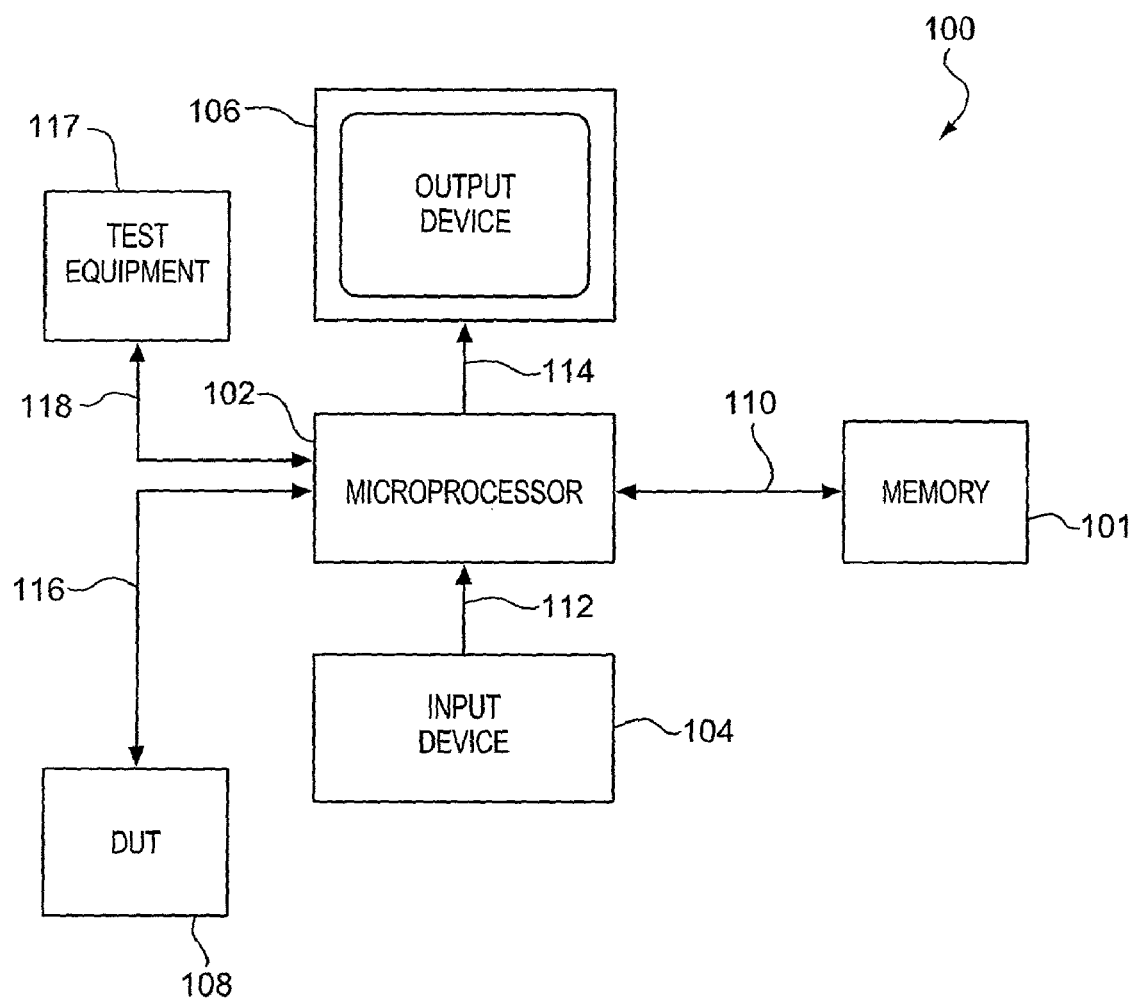
FIG. 1 is a block diagram of the principal hardware components of the preferred embodiment of the present invention.

The present invention relates to an electronic test executive program. FIG. 1 illustrates a computer system 100 that executes a test executive program in accordance with this invention. Computer system 100 includes memory 101, microprocessor 102, input device 104 and output device 106. Memory 101 connects to microprocessor 102 via path 110. Memory 101 may be a non-volatile memory such as a Read Only Memory (ROM) or a volatile memory such as a Random Access Memory (RAM). Input device 104 connects to microprocessor 102 via path 112. Input device 104 may be a keyboard, mouse, joystick, or any other device and software driver that allows a user to input data.

In a preferred embodiment, the test executive program of this invention is stored as instructions in memory 101. Those skilled in the art will recognize that the instructions may either be stored as computer software and/or firmware that is readable and executable by microprocessor 102. The results for the tests performed by the test executive program are displayed on output device 106. Output device 106 is a display and associated drivers that allow an application to display images to a user. Those skilled in the art will recognize that the display may be a conventional cathode ray monitor or Liquid Crystal Display (LCD). The actual display used does not matter for purposes of this invention.

Microprocessor 102 executes the test executive program of this invention. Microprocessor 102 communicates with a Device Under Test (DUT) 108 via path 116. Microprocessor 102 controls test equipment 117 via electrical line 118. Signals received via path 116 and electrical line 118 by microprocessor 102 are saved in memory 101.

One skilled in the art will recognize that this invention may be implemented by any electronic device having the same general configuration outline in FIG. 1. These electronic devices include but are not limited to a computer system, logic circuits embedded in hardware, and an electronic analyzer.

As will be discussed in more detail below, each DUT to be tested is one of a group of devices that can be tested by the test executive software. Each such device is called a "model" herein. As known in the art, the characteristics of the model determine what sort of tests should be done on the model. For example, an oscilloscope has certain characteristic electrical components, each of which will have a test procedure that is determined by what needs to be tested to determine if each component works properly. Procedures generally specify which tests are to be performed without specifying how the tests are to be performed. In the prior art, each time a test for, say, an oscilloscope was designed, the test engineer created a test algorithm that completely defined the test for that particular oscilloscope. The test engineer then created a data table that provided all the input data for the algorithm. When the design parameters for the oscilloscope were changed, the test algorithm and data table had to be changed also. As will be seen more clearly below, in the test executive system according to the invention, the test algorithm and data tables are created on the fly by the system according to the invention.

The test executive system 100 according to the invention, in general, functions as follows: it presents a list of models for which test software is available, and the user selects a model to be tested; the program then uploads the test software corresponding to the selected model; the program then asks the uploaded software for a list and description of procedures and presents these to the user; the program pauses while the user selects one of the procedures; when the procedure is selected, the program retrieves the selected procedure from the software and expands it into tests, measurements and datapoints, each of which will be discussed in detail below. The test executive system then loops through the tests, measurements and datapoints, generating a data structure on the fly.

The software program according to the invention is illustrated in FIGS. 2-5, which will be discussed below. A key aspect of the program according to the invention is that it is hierarchical; that is, it includes multiple levels, with each level branching to lower levels which it contains. Preferably, the hierarchy is a four-level hierarchy including the following levels: procedure, test, measurement and datapoint. A procedure is an ordered list of tests; procedures have names like "Turn-on", "Final", and "Environmental". A test is a group of measurements in a procedure that share the same test algorithm, and thus the same software code. Tests have names like "Amplitude Accuracy" and "Harmonic Distortion". A measurement is a configuration or setup for a Test, and provides parameters to a Test. Measurements have names like "Range=10 volts", "Frequency=100 kHz", and "Harmonic=3". A datapoint is a subset of a measurement containing additional parameters that select a result when one measurement generates multiple results. Datapoints have names like "Channel=1" and "Peak". The hierarchy is preferably implemented in the software as a tree of four objects, each of which maps to one of the hierarchical levels. Interactions of the objects are governed by pointers which reflect relationships between hierarchical levels.

Before embarking on the detailed discussion of the invention, it would be helpful to define terms which will be used in this discussion. The term test software herein means the code components 206 provided by a test developer to test a specific product. The term input device means a keyboard, a knob, a spin control, a mouse, a joy stick, a touch pad or a roller ball and other conventional input devices. The term string means a data structure composed of characters, usually in human-readable text.

The term component object model (COM) means component architecture independent and platform independent computer language that is meant to be a general purpose, object-oriented means to encapsulate commonly used functions and services. The COM defines the name, return type and parameters of the interface's methods. The term object means a software object, and, as known generally in the type of programming known as "object oriented programming", is a specific instance of set of functions or methods collected into interfaces and each object has data associated with it. Methods are the action that a message carries out, the code which gets executed when the message is sent to a particular object. All communications to objects are done via messages. Messages define the interface to the object. Classes define what it is to be an object. Creating an object from a class means to have created an instance of the class. The instances of the class are the actual objects. Classes are the blueprint of an object. Objects are unique individual instances of a particular class. The term interfaces means a defined collection of properties and methods that can be implemented by a class. The interface is essentially a table of pointers to the functions that make up the interface. Pointers are an indirect reference to data or code, analogous to an address. A collection is a list or an array of references to objects. Each interface under COM is numerically unique. A class can be derived from one or more other classes; this is known as inheritance.

COM supports interface inheritance, which means the interface may be derived from another interface, inheriting the base interface's binary signature. The combination of the name and parameter of a method is usually called its signature. Delegation means the derived object creating or instantiating an instance of the base object. The derived object contains code for new behaviors and methods that are overridden, and serves as a pass through for those method calls that are unchanged. The term computer platform means a software operating system and/or open hardware such as Windows™ NT™ application. The term dynamic link library (DLL) means an executable code module for computer platforms that can be loaded on demand and linked at run time and then unloaded when the code is no longer needed. Test software is contained in DLL files, so they can be developed and delivered independently.

A feature of the invention is the COM interface which includes an object model that aids in test and procedure organization. The invention encourages efficient and accurate test routine development through the use of parameters designed specifically by the test developer. Also, because of the object nature of the invention, parameters can be easily modified and reused for new test procedures, without generating extra parameters for the new test procedures.

Detailed Description

The software program according to the invention is most easily developed utilizing the Visual Basic™ programming language, which is a productive, efficient and current programming language. This standard programming language enables test developers to easily and efficiently construct complex test procedures.

Test software for a specific model is packaged in a DLL file. When the test operator selects a different product model family, this test software DLL is de-referenced, unloaded and different test software DLL is loaded. The data objects that are shared by test software and the invention are defined in a DLL file named Exec3Objects.DLL. This file contains mostly class definitions for data objects and test interfaces, and it contains little or no invention code. In other words, Exec3Objects.DLL contains the pure virtual base classes that define the interface between the Exec3 and Test Software. Actual Test Software classes are derived from these base classes by using Visual Basic™ IMPLEMENTS™ keyword. When in this disclosure the term "add" is used in the context of adding one object to another object, this function can be performed in any way known in the art, such as by using pointers to indicate that one object is included in another object, or by actually including code within other code.

Figure 2:
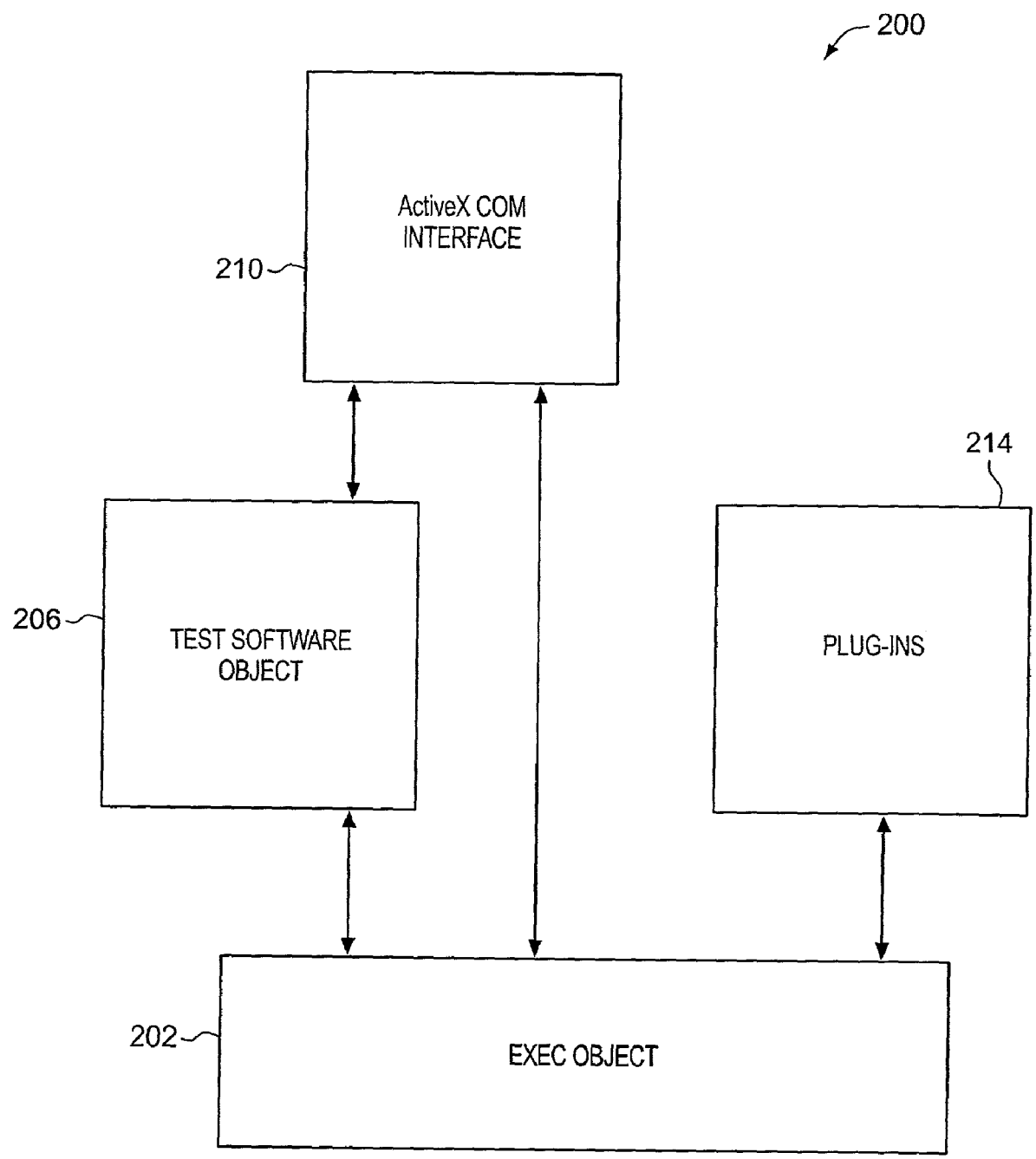
FIG. 2 is a block diagram of the test system and related interface objects.

FIG. 2 is a block diagram of the preferred embodiment of a test executive program 200 according to the invention. The program preferably includes an interface 210 which permits the system 200 to be initiated and monitored externally by other computer systems, which is preferably an ActiveX™ COM interface 210. An Exec object 202 contains the class definitions of data objects and test interfaces, and essentially provides the interfaces to operate the program. During operation, the current test object 308 (FIG. 3) and measurement object 312 are referenced by Exec object 202. Test software object 206, shown in detail in FIG. 3, contains the code components written by the test developer to test a specific product. In this discussion, the term test software object is distinct from the term test object. There is a one-to-one correspondence between the model family and test software objects 206. System 200 also includes plugs-ins 214 which are interfaces between system 200 and other systems, such as an equipment calibration verification system or other software systems, such as a database, for example, Excel™.

The main/root object of the invention's preferred ActiveX™ interface is its application object. Instantiating this object will start the invention's application executable file. The application object contains a model family string which is the name of the test software, as listed in the invention's configuration initialization file and so on the invention's "Model" menu. Setting it will cause the invention to load new test software. Also contained in the application object is the name of the active test procedure. Setting it will cause the invention to load and expand a test procedure. Test software for a specific model is packaged in a DLL file. When the test operator selects a different model family, this test software DLL is de-referenced, unloaded and different test software DLL is loaded. The class definitions of data objects that are shared by test software and the invention are defined in a DLL file named Exec3Objects.DLL. Actual Test Software and Plug-in classes are preferably derived from these base classes by using Visual Basic™ IMPLEMENTS™ keyword.

Figure 3:
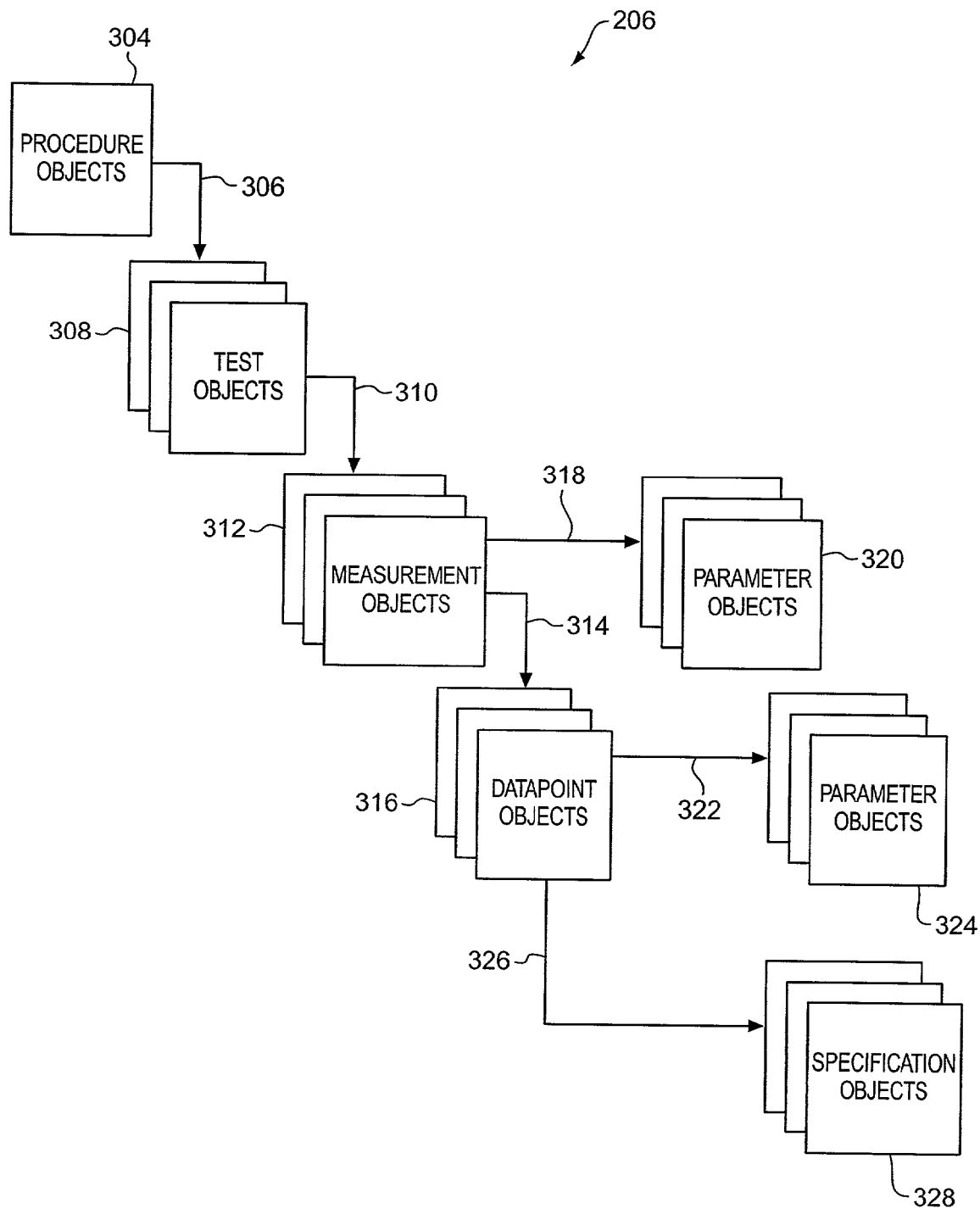
FIG. 3 is a block diagram of the hierarchy of the custom data structure components.

FIG. 3 shows the details of the test software object 206. It also illustrated in block diagram form the invention's hierarchical structure. In one aspect, test software 206 corresponds to a product model family file the test developer creates to test a family of specific devices. The test software DLL package is typically one Visual Basic™ project and can be kept under revision control. The top tier of the hierarchical structure is the procedure objects 304. The procedure object 304 tier is an ordered list, sequence, or script 306 of test objects (not to be confused with the test software 206) 308 to be run. Each test object 308 includes a collection 310 of measurement objects 312 and datapoint objects 316. The test software DLL file defines these procedure objects 304. A test operator can select a subset of a procedure object 304 to run. The invention runs a procedure object 304. The invention views procedure objects 304 as input data, not code. The procedure object 304 contains no significant code and can be thought of as a group of related variables, custom data structures, COM objects or as property-only (or code-less) Visual Basic™ classes.

A procedure object 304 is preferably transferred from the test software DLL as a structure of COM objects. The test developer defines a procedure object 304 by writing code to build this structure of COM objects. A procedure object 304 name identifies the procedure to the test operator and contains a collection of test objects 308. The invention owns procedure objects 304 and they are created by the test developer-supplied code in test software initialization. The second tier of the invention is the test object 308 tier. The test object 308 tier is a group of measurement objects 312 that share the same test algorithm and so the same test software code. To run a procedure, the invention repeatedly calls a test for each measurement and datapoint. To the invention, test objects 308 are code, not data. The test developer implements a test by adding a Visual Basic™ Class module to the test software object 206. The code the test developer puts in this class should implement the test algorithm in a parameter-driven way. Then, in the procedure definition code, the test developer inserts code test software objects 206 to create an instance of this class and adds it to the procedure object 304. Test software objects 206 owns test objects 308.

The test object 308 name identifies the measurements to be performed by the test operator. The test object 308 also contains the test initialization method code, the measurement initialization method code and the results get method code. Each test should be implemented as a separate Visual Basic™ class file and use the implements keyword to reference the test interface. The test objects contain a collection 310 of measurement objects 312.

The third tier of the invention is the measurement object 312 tier. The measurement object 312 is a configuration or setup for a test object 308. Each measurement within a test object 308 can have different setup or configuration parameters. Test objects 308 are parameter-driven and test objects 308 get their parameters from a measurement object 312. The invention views measurement objects 312 as data to be passed from a procedure object 304 to a test object 308. The test developer defines a measurement object 312 for a test object 308 by creating a new measurement object 312 and adding it to a test object 308 in a procedure object 304. The measurement class is already defined by the invention, so the test developer needs only to create and use measurement objects 312. A measurement is also a phase of test execution.

The measurement object 312 contains a collection 318 of parameter objects 320 for one measurement and a collection 314 of datapoint objects 316 that select among multiple results from one measurement. The measurement object's 312 name identifies the measurement to the operator. The measurement object 312 also contains the name of the measurement object 312.

The fourth tier of the invention is the datapoint object 316 tier. The datapoint object 316 tier is a subset of a measurement object 312 that holds a collection 322 of parameter objects 324 that select a result when one measurement generates multiple results. One measurement may return one or more datapoints as logically makes sense to the test developer. Some examples of multiple datapoints for a measurement are minimum and maximum values of a spectrum analyzer sweep, or each channel of a device. Getting results for each datapoint object 316 is also a phase of test execution. This is where the data is harvested. If it doesn't make sense to separate the measurement phase from the datapoint harvesting phase, the test developer can write a test to do the entire measurement during the datapoint harvesting phase.

A datapoint object 316 holds the parameter objects 324 for one datapoint. This information selects specific results when a measurement generates multiple results. The name identifies the datapoint to the operator and can be blank if there is only one datapoint object 316 in the measurement. Each measurement object 312 has a collection 314 of datapoint objects 316. A datapoint object 316 holds a collection 322 of parameter objects 324. The datapoint object 316 also contains the name of the datapoint object 316 and can be automatically generated by concatenating the description of each parameter object 324. It can be over-written by assigning a value to the name. Within each measurement, each datapoint name must be unique and cannot contain the comma character. Within each datapoint object 316 is a collection 326 of specification objects 328. The test software objects 206 owns datapoint objects 316.

A parameter object 324 holds one test parameter setting and it passes measurement configuration parameters from a procedure to a test. The parameter object 324 contains the parameter being specified, like "Frequency", and the value, like 1.0E+7. The parameter object 324 also contains a Boolean value where if it is true the parameter won't appear in measurement and datapoint names. If the Boolean value is set to false, the parameter will be visible.

A test software object 206 contains a show method that the invention will call when the operator clicks the test software item in the invention's menu. The test software object 206 contains methods that the invention calls when the test operator changes model families. The electronic test system 100 will display a list of available procedures by listing each test procedure. Models is a collection to which the test initialization software should add strings, one for each valid model number.

In addition, the test software object 206 contains a procedure expand method and a procedure collapse method that the invention calls to get the details for one procedure. This procedure expand method creates the objects shown in FIG. 3. Further, the test software object 206 contains a procedure initialization method and a procedure de-initialization method that the invention calls when beginning a procedure and ending a procedure.

Figure 4:
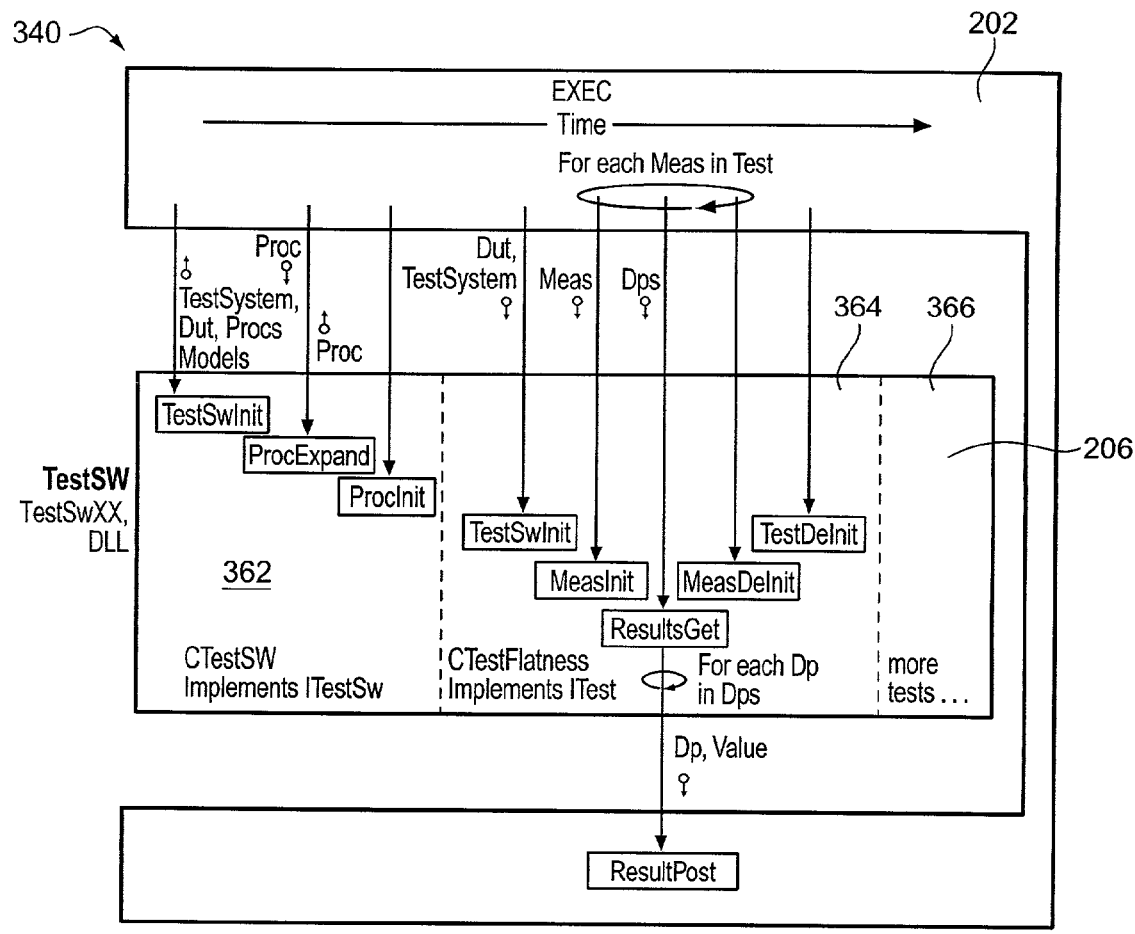
FIG. 4 is a schematic illustrating the methods in the test software, their interaction with the base Exec 202 program, and the order in which they are called.

Turning to FIG. 4, the methods of the test software 206 and the order of execution of the methods is shown schematically. In this figure, the outer polygon represents the Exec object 202, and the middle box represents the test software 206, which is illustrated as TestSw.DLL code. The left portion 362 shows three methods in a class named "CTestSw". The middle of this box shows an example test class 364, named "CTestFlatness". Other tests, 366, usually are also included, but only one is illustrated fully. Each test preferably has the methods shown. The methods are arranged from left to right, in the order that the Exec object 202 will call them. The following describes each phase of the sequence.

First Exec 202 calls TestSwInit. This occurs immediately after Exec 202 loads TestSw DLL. Exec 202 calls TestSwInit to get information from the test software 206, including a list of models that can be tested, a list of procedure names, and references to objects representing the DUT and test system. Then, after the operator selects a procedure, Exec 202 calls ProcExpand. ProcExpand builds the structure of Test, Meas, and Dp objects that define the details of the procedure. In FIG. 4 and the tables that follow, Proc is a procedure object, Meas is a measurement object, and Dp is a datapoint object. When this structure of objects is returned to the Exec object, it displays the selected procedure to the operator. When the operator starts the procedure, the Exec object calls ProcInit. The ProcInit code initializes test system I/O, etc.

The system then enters the test stage 364. Exec 202 calls the TestInit method in the first test. In this method, preferably, the test system and DUT are preset, and setups that are common for all measurements in the test are performed. Pass parameters for this method preferably include a reference to the DUT object, which has properties for Address, Slot, etc. The Exec 202 program then enters a loop to call the MeasInit, ResultsGet, and MeasDeInit methods of the test, once for each Measurement. The MeasInit pass parameters include one Meas object. This Meas object was created and added to the procedure by the test developer in the ProcExpand method. The Meas object can include many parameter objects, which define the configuration for the measurement. Therefore, the code in the MeasInit method will typically use the values of these measurement parameters to configure the test system and DUT.

Exec 202 calls ResultsGet, and passes it a collection of datapoints for the current measurement. These Dp objects are ones also created and added to the Procedure in the ProcExpand method. For each Dp, the ResultsGet method preferably "calls back" to Exec's ResultPost method. The pass parameters sent to ResultPost preferably include a measured datapoint value to be compared by the Exec object to the specification. Exec 202 calls MeasDeInit before calling MeasInit for the next measurement. When all measurements have been run, Exec 202 calls TestDeInit before moving to the next test. The above objects are generally looped through until the procedure finishes or is aborted, at which time Exec calls the ProcDeInit method of TestSw 206. Similarly, the ProcCollapse method is called to change another procedure, and the TestSwDeInit method is called to unload the TestSw object.

An example of test software and the process of calling it up and creating a test and data structure follows. The test software is preferably written in Visual Basic™ (VB) and the software code described below is VB code. Class module names start with "C" and are saved in a file name that does not include the "C" prefix. In this discussion, classes, programs, and subprograms are capitalized, and variables are italicized. Preferably, the test software contains the following class files. CTestSw (TestSw.cls) is the class where the TestSwInit, ProcExpand, and ProcInit methods are implemented. This class is the initial interface between the TestSw and Exec objects so the module name is "CTestSw", and this module must implement the ITestSw interface defined by the Exec objects. The class files CDutE1234 (DutE1234.cls) and CTestSystemE1234 (TestSystemE1234.cls) represent the Dut and TestSystem. Preferably, the code uses the VB Implements keyword so the classes are derived from the IDut and ITestSystem class defined by the Exec object. The class files will also contain one or more tests, such as CTestAmplitudeAccuracy (TestAmplitudeAccuracy.cls) and CTestFlatness (TestFlatness.cls). The class files will also contain one or more additional files that are specific to a test software 206 project, such as FFT(FFTMath.bas).

The test system allows the operator to select which procedure should be run. Once selected, the test system calls the method, ProcExpand, an example of which is given below. It sends the selected procedure as an empty procedure object (Proc) that is filled in by the test software code. The procedure object is preferably created in two steps. First, the TestSw ProcExpand method creates and adds test objects. Second, it calls a ProcExpand method in each individual test to add their measurements and datapoints. This technique more closely associates the procedure generation code with the test code.

An example of an amplitude accuracy test (CTestAmplitudeAccuracy) will now be given. The ProcExpand method in TestSw.cls for this test is given in Table 1.

TABLE 1

```
Public Sub ITestSw_ProcExpand(ByVal Exec As ExecObjects.IExec, _
1                              ByVal Proc As ExecObjects.CProc)
2    If Proc.Name <> "Turn-on" Then
3        Dim oAmplitudeAccuracy As New CamplitudeAccuracy    'Create the test
4        oAmplitudeAccuracy.ProcExpand Exec, Proc             'Expand it
5        Proc.Tests.Add oAmplitudeAccuracy                    'Add it to the Proc
7        '... add more tests here
8    End If
End Sub
```

The line numbers are not part of the code, but are provided to reference the following explanatory notes:

Line 1: Notice the method name is prefixed with "Ites_" because this is how VB names methods that implement external interfaces. Pass parameters include Exec—, an object that gives access to Exec 202 (FIG. 2) object settings, and Proc—, the procedure that is to be expanded by the code;

Line 2: This line checks Proc.Name to determine if this test should be included in the current procedure.

Line 3: The Amplitude Accuracy Test object is created by New-ing the derived class that Implemented the ITest interface.

Line 4: The ProcExpand method of the Amplitude Accuracy Test is called to do the details for this test (described next).

Line 5: The Test is added to the tests collection of the procedure.

In Table 2 below, there is shown an example of the ProcExpand method in TestAmplitudeAccuracy.cls, and is called from the ProcExpand method above. This example builds a procedure with the following Measurements:

Range=1 Vp; Freq=1 kHz
Range=1 Vp; Freq=1 MHz
Range=100 mVp; Freq=1 kHz
Range=100 mVp; Freq=1 MHz
Range=10 mVp; Freq=1 kHz
Range=10 mVp; Freq=1 MHz
and each Measurement has the following Datapoints:
Ch=1
Ch=2
Ch=3

Line 4: This line begins an inner loop to iterate through values of the 2nd Measurement parameter, "Freq".

Line 5: This line starts a block of code that creates and configures a Meas object. m_colMeases is the collection of Meas objects for the test. The NewMeasBegin method creates a new Meas object, which is accessed in the next several lines, until the NewMeasEnd statement. (The m_colMeases collection is the internal-to-the-test equivalent of the external Meases property.)

Line 7: The Params.Add method is called to add a Parameter to the Measurement. The Param name is "Range", its units are "Vp", and its value is assigned from a For loop variable. In a similar fashion, the next line adds a 2nd Parameter named "Freq". It is best to keep parameters values in fundamental units like Hz and Volts. Exec 202 will apply engineering formats when it displays them. Imposing this structure on parameters will make it easier to plot results vs. any parameter.

Line 10: This line begins a For/Next loop to create 3 Dps for each Meas.

Line 11: NewDpBegin creates a Dp object that is referenced in the next lines, until the NewDpEnd statement.

Line 12: A Parameter is added to the current Dp.

Line 13: A Spec is added to the Dp. The pass parameters for the SpecAdd method include Units, Customer limits, Production limits, Marginal limits, and a Target (or ideal) value. The last item, "##0.00" is a format string, (see the VB Format( ) function). If the limits vary for different values of a measurement parameter, code to calculate the limit can be inserted here. Specs can also be added later, during test execution.

TABLE 2

```
Public Sub ProcExpand    (ByVal Exec As ExecObjects.IExec, _
                         ByVal Proc As ExecObjects.CProc)
1      Dim vRange As Variant
2      For Each vRange In Array(1#, 0.1, 0.01)
3          Dim vFreq As Variant
4          For Each vFreq In Array(1000#, 1000000#)
5              m_colMeases.NewMeasBegin
6              With m_colMeases.Meas
7                  .Params.Add "Range", vRange, "Vp"
8                  .Params.Add "Freq", vFreq, "Hz"
9                  Dim nCh As Integer
10                 For nCh = 1 To 3
11                     Dps.NewDpBegin
12                         .Dps.Dp.Params.Add "Ch", nCh, ""
13                         .Dps.Dp.SpecAdd "mV", -1.5, -1.4, -1.3, 0, _
                                            1.3, 1.4, 1.5, "##0.00"
14                     .Dps.NewDpEnd
15                 Next nCh
16             End With
17             m_colMeases.NewMeasEnd
18         Next vFreq
19     Next vRange
End Sub
```

The line numbers are not part of the code, but are provided to reference the following explanatory notes:

Line 2: This line begins a loop that iterates through the values of the 1st Measurement parameter, "Range". VB's "For Each v In Array( )" is the preferred method of stepping through an arbitrary sequence of values. It requires a Variant-type variable. A For/Next loop can be used if the step size is uniform, as can other programming techniques that suit the job.

Line 14: The NewDpEnd method adds the Dp to the Meas object's Dps collection.

Line 17: The NewMeasEnd method adds the Meas to the Tests object's Meases collection.

That is all that is needed to generate Procedure Definition Code for 18 Datapoints. When ProcExpand returns, Exec 202 will display these 6 Measurements, each with 3 Dps. When the operator starts testing, Exec 202 will call the methods in the test 6 times, passing it a different Meas object each time. The methods Exec 202 will call are explained next.

As indicated in FIG. 4, when the operator starts a procedure, TestInit is the first method of the test that Exec 202 will call. Typically, the software developer will add code to initialize the TestSystem, initialize the DUT, and make any configuration setups that are common for the test. TestInit is called only once, before calling MeasInit for each measurement. As shown in FIG. 4, and as will be discussed in more detail below, Exec 202 calls the ProcInit method in TestSw.cls before calling TestInit for the first test. ProcInit is a preferred place to open I/O paths and initialize other items that are common to all tests. An example of TestInit is given in Table 3.

TABLE 3

```
Public Sub ITest_TestInit   (ByVal Exec As ExecObjects.IExec, _
1                            ByVal TestSystem As ITestSystem, _
                             ByVal Dut As IDut)
2    Dim oDutE1234 As CDutE1234, oTestSystemE1234 As
     CTestSystemE1234
3    Set oDutE1234 = Dut
4    Set oTestSystemE1234 = TestSystem
5    oTestSystemE1234.Preset
6    oTestSystemE1234.Hookup "Accurate source to Dut Input"
7    oDutE1234.Preset
End Sub
```

As before, the line numbers are not part of the code, but are provided to reference the following explanatory notes:

Line 1: Exec 202 passes several objects to the TestInit method: Exec is an object that provides access to Exec's settings. TestSystem and Dut are objects created and provided to Exec 202 during TestSwInit, which will be discussed later. Exec 202 expects the TestSystem 206 and DUT to be objects to be derived from the ITestSystem and IDut classes defined by Exec. Derived from means these preferably are written to Implement the methods and properties in ITestSystem and IDut. Then the test developer can add additional methods and properties as needed and as is common in object oriented programming.

Lines 2-4: In this project, Exec's IDut base class has been extended by adding properties and methods like "Range" and "Preset". Likewise, Exec's ITestSystem has been extended to include a "Preset" method and a "Hookup" method. To access these extended methods from VB, it is preferable to Dim a variable As the derived class. Then it is preferable to Set it to the object reference Exec 202 passed in.

Lines 5 and 6: These lines configure the test system. The Preset and Hookup are methods the developer added to the CTestSystemE1234 class, in the file TestSystemE1234.cls. This file is discussed later.

Line 7: The DUT is preset by calling a method the developer added to the file DutE1234.cls.

Once TestInit has completed, Exec 202 will call the MeasInit, ResultsGet, and MeasDeInit methods for each Measurement in the Procedure, as indicated in FIG. 4. Preferably, the MeasInit method sets up and starts the measurement. An example of the MeasInit subprogram is given in Table 4.

TABLE 4

```
Public Sub ITest_MeasInit   (ByVal Exec As ExecObjects.IExec, _
                             ByVal TestSystem As ITestSystem, _
1                            ByVal Dut As IDut, _
                             ByVal Meas As ExecObjects.CMeas)
2    Dim oDutE1234 As CDutE1234, oTestSystemE1234 As
     CTestSystemE1234
3    Set oDutE1234 = Dut
4    Set oTestSystemE1234 = TestSystem
5    oDutE1234.Range = Meas.Params("Range").Value
6    oTestSystemE1234.Amplitude = Meas.Params("Range").Value
7    Exec.Wait 0.5        'Wait for settling
8    Exec.Disp "Starting measurement"
9    oDutE1234.StartMeasurement
End Sub
```

The line numbers are not part of the code, but are provided to reference the following explanatory notes:

Line 1: The pass parameters to MeasInit are the same as TestInit, with the addition of a Meas object. This Meas object is one of the Meas objects that were created earlier in ProcExpand.

Lines 2-4: see notes following the TestInit subprogram (Table 3), above.

Lines 5 and 6: These lines take the value of a Measurement Parameter and use it to setup the DUT and TestSystem. Meas.Params is a VB collection of all the parameter objects that were added to the Meas object. Because the parameter Name is used as a key, Meas.Params ("Range") returns a reference to the Param object for Range. Refer back to line 7 of ProcExpand to see where this Param was added.

Lines 7 and 8: These lines call some utility methods of the Exec object 202. Wait waits a specified number of seconds.

Line 9: StartMeasurement is another method that the developer added to the DUT object.

After MeasInit completes, Exec 202 calls the ResultsGet method and passes in a collection of Datapoints. For each Dp in the collection, the software code gets the measurement result and sends it to Exec 202 by calling Exec.ResultPost. An example of ResultsGet is shown in Table 5.

TABLE 5

```
Public Sub ITest_ResultsGet  (ByVal Exec As ExecObjects.IExec, _
                              ByVal TestSystem As ITestSystem, _
1                             ByVal Dut As IDut, _
                              ByVal Meas As ExecObjects.CMeas, _
                              ByVal Dps As ExecObjects.CDps)
2    Dim oDp As ExecObjects.CDp, nCh As Integer, rMeasuredValue As
     Double
3    Dim oDutE1234 As CDutE1234
4    Set oDutE1234 = Dut
5    Do
6        Exec.Wait 0.1
7    Loop Until oDutE1234.MeasurementDone
8    If Not oDutE1234.MeasurementOverload Then
9        Err.Raise eeTestError, "Dut", "Dut Overloaded"
10   End If
11   For Each oDp In Dps
12       nCh = oDp.Params("Ch").Value
13       If nCh > 2 Then
14           Exec.ResultPost oDp, rtNotApplicable, Empty
15       Else
16           rMeasured Value = oDutE1234.ReadMarkerMax(nCh)
17           If rMeasuredValue < -99 Then
18               Exec.ResultPost oDp, rtError, "Unreasonable
                 measurement"
19           Else
20               Exec.ResultPost oDp, rtNormal, rMeasuredValue
21           End If
22       End If
23   Next oDp
End Sub
```

Again, the line numbers are not part of the code, but are provided to reference the following explanatory notes:

Line 1: The pass parameters to ResultsGet are the same as MeasInit, with the addition of Dps, a collection of Dp objects. These Dp objects were created earlier in ProcExpand.

Lines 3 and 4: See notes following the TestInit subprogram (Table 3), above.

Lines 5-7: This loop waits for the DUT to finish the measurement started in MeasInit. Preferably, a Wait, even for 0 seconds, should be included in any such loops. Wait is like VB's DoEvents because it allows Exec's user interface to respond to the operator. If the operator aborts the test, Wait will raise an error.

Lines 8-10: The test code can use VB's Err.Raise event to communicate measurement errors. eeTestError is an error number defined by Exec 202. When an error is raised, Exec 202 will log the Err.Description string in the test results. Exec may also pause testing if the operator has selected "Stop on Errors".

Line 11: This line begins a For/Next loop to iterate through each Dp in the collection. If your test is only expecting a single blank Dp, a loop is not needed, and the Dp can be referenced with "Dps(1)".

Line 12: A local variable nCh is set to the channel number, which is found in a Parameter of each Dp. Like Meas objects, Dp objects can have more than one parameter.

Lines 13 and 14: This IF is an example of how the software code can handle a Dp that is "Not Applicable", perhaps due to DUT options. For a missing channel, this code calls Exec.ResultPost with ResultType=rtNotApplicable. This tells Exec 202 to quietly ignore the Dp.

Line 16: A method the developer added to the Dut class is called to read the marker.

Lines 17 and 18: This IF checks for a reasonable measurement, which is good practice because it prevents mistakes like a disconnected cable from corrupting the statistical distribution of any results database. Exec.ResultPost is called with ResultType=rtError to tell Exec 202 the Dp is in Error, and Exec will treat it much like a spec failure. This method allows the remaining Dps to be posted normally—in contrast, raising an error here would not.

Line 20: This line sends the measured result to Exec 202 by calling Exec.ResultPost. Exec 202 will check it against specification limits, log it, and send it to any Exec Plug-ins. Although not shown here, ResultPost has two additional, optional pass parameters: AtValue and AtUnits. These can be used to log additional Dp information that is not compared to limits.

In the following, we discuss other TestSw.cls code. Exec 202 calls TestSwInit immediately after it loads the TestSw DLL written by the test developer. One purpose of TestSwInit is to transfer information from Test Software 206 to Exec 202, including a list of models that are available for testing, a list of procedure names, and references to objects representing the DUT and test system. The TestSwInit method preferably initializes the software, but preferably does not initialize any test system I/O or Dut I/O, because the operator has not yet had a chance to enter or change device addresses. An example of TestSwInit is given in Table 6.

TABLE 6

```
Public Sub ITestSw_TestSwInit      (ByVal Exec As ExecObjects.IExec, _
                                    TestSystem As ExecObjects.ITestSystem, _
1                                   Dut As ExecObjects.IDut, _
                                    Procs As ExecObjects.CProcs, _
                                    Models As Collection)
2       Models.Add "E1234A"
3       Models.Add "E1234B"
4       Dim oTestSystemE1234 As CTestSystemE1234
5       Set oTestSystemE1234 = New CTestSystemE1234
6       Set TestSystem = oTestSystemE1234
7       oTestSystemE1234.TestSystemInit Exec
8       Set Dut = New CDutE1234
9       Set Procs = New Cprocs
10      Dim oProc As CProc, vProcName As Variant
11      For Each vProcName In Array("Environmental", "Final")
12          Set oProc = New CProc
13          oProc.Name = vProcName
14          Procs.Add oProc
15      Next vProcName
End Sub
```

As before, the line numbers are not part of the code, but are provided to reference the following explanatory notes:

Line 1: The TestSystem, Dut, and Procs are important pass parameters for this method. They will be Nothing when Exec 202 calls TestSwInit, and the test developer's code should create (or New) these objects and return them to Exec.

Lines 2 and 3: The list of specific model numbers is added to the Models collection. Exec 202 will display these in a drop-down box on the Dut Serial Number entry form.

Lines 4 and 5: These lines create a TestSystem object. In this case, it is created from the class in the file TestSystemE1234.cls, derived from Exec's ITestSystem, which will be reviewed later.

Line 7: The TestSystemInit method of the test system object 206 is called. In the code for TestSystemE1234.cls, discussed below, it will be shown that this method adds Devices to the test system.

Line 8: This creates a Dut object and returns a reference to Exec.

Line 9: This creates a new, empty, collection of Procedures.

Lines 10-15: This loop creates a Proc object for each procedure and adds it to the Procs collection. When the user selects a procedure, Exec 202 will call ProcExpand for the selected Proc object.

Exec 202 calls ProcInit when the operator starts running a Procedure. As mentioned above, this is a good place to open I/O paths for the devices in the Test System and maybe the Dut. An example of ProcInit is given in Table 7.

TABLE 7

```
Public Sub ITestSw_ProcInit    (ByVal Exec As ExecObjects.IExec, _
                                ByVal TestSystem As ExecObjects.ITestSystem, _
                                ByVal Dut As ExecObjects.IDut)
    Dim oTestSystemE1234 As CTestSystemE1234
    Set oTestSystemE1234 = TestSystem
    oTestSystemE1234.ProcInit Exec
End Sub
```

The above code calls a ProcInit method the developer has written in TestSystemE1234.cls. This method uses the .Address property of each device to open its I/O path.

The TestSystemE1234.cls class file defines a "custom" test system object that Implements the ITestSystem interface defined by Exec. The ITestSystem interface includes all the properties that Exec 202 needs to document the test equipment, etc. In the following example in Table 8, the TestSystemE1234 subprogram extends the TestSystem class by adding several methods: Preset, Hookup, Amplitude, TestSystemInit, ProcInit.

TABLE 8

```
1  Implements ExecObjects.ITestSystem
2  Private m_sName As String
3  Private m_sId As String
4  Private m_colDevices As New CDevices
5  Private m_oMore As Object
6  Private m_vTag As Variant
'--------------------------------------------------------
7  Public Property Let ITestSystem_Name(ByVal RHS As String)
8     m_sName = RHS
9  End Property
'--------------------------------------------------------
10 Public Property Get ITestSystem_Name( ) As String
11    ITestSystem_Name = m_sName
12 End Property
...Additional Property Let and Property Get subs not shown...
'--------------------------------------------------------
13 Public Sub Preset( )
14    HpibWrite id3325, "*RST"
15    HpibWrite id3458, "*RST"
16 End Sub
'--------------------------------------------------------
18 Public Property Let Amplitude(ByVal NewAmplitude As Double)
19    HpibWrite id3325, "AM " & NewAmplitude & "VO"
20 End Property
'--------------------------------------------------------
22 Public Sub TestSystemInit(ByVal Exec As ExecObjects.IExec)
23    Dim oDevice As CDevice
24    Set oDevice = New CDevice
25    oDevice.Name = "HP3458"
26    m_colDevices.Add oDevice
27    Set oDevice = New CDevice
28    oDevice.Name = "HP3325_1"
29    m_colDevices.Add oDevice
45 End Sub
'--------------------------------------------------------
40 Public Sub ProcInit(ByVal Exec As ExecObjects.Iexec)
41    id3325 = HpibOpen(m_colDevices("HP3325_1").Address)
42    id3458 = HpibOpen(m_colDevices("HP3458").Address)
43 End Sub
```

Again, the line numbers are not part of the code, but are provided to reference the following explanatory notes:

Line 1: The Implements statement says that this class is derived from the ITestSystem class defined by Exec.

Lines 2-6: These lines dimension some variables to support the properties required by Exec's ITestSystem interface. By convention, they have a "m_" prefix because their scope is "module private". The variable m_sName is a string to store the Name of the test system. They are private because they are accessed through public properties (see below).

Line 4: m_colDevices is a collection of Device objects, one for each piece of equipment in the test system. External to this module, it is referenced through the Devices property.

Lines 7-12: This is the property Get/Let methods for the .Name property of ITestSystem. This is boiler-plate code that preferably is copied into every test program. If this code was not included, VB would complain because the module no longer implemented the ITestSystem interface.

Lines 13-16: The Preset method is an example of a method the developer can add to extend and customize the TestSystem class. In this example, Preset calls a HpibWrite, a developer-written sub, which we assume calls an I/O function. Refer back to the TestInit method of TestAmplitudeAccuracy.cls (Table 3) to see how Preset can be called from a test.

Lines 18-20: The Amplitude property sets the signal amplitude. Refer back to MeasInit method of TestAmplitudeAccuracy.cls (Table 4) to see how it is invoked.

Line 22: This is the beginning of TestSystemInit, a method called from TestSwInit in TestSw.cls, when the TestSw DLL is first loaded. Its purpose is to create the Device objects for the TestSystem.

Lines 24-26: These lines create a CDevice object for a piece of equipment in the test system, and add it to the TestSystem.Devices collection.

Lines 40-43: This TestSystem ProcInit method is called from the ProcInit method in TestSw.cls (Table 7 above). It opens the I/O for the test system, using the Address property of each Device object. The HpibOpen function and the id3325 variable are defined elsewhere. As will be recognized by those skilled in the art, a corresponding ProcDeInit method should close the I/O paths.

In this example, CTestSystemE1234 is in the same VB project as the TestSw, and so in the same .DLL. It is possible to move the TestSystem code to a separate VB project. This is preferable if more than one TestSw project will be using the same TestSystem.

In Table 9, a DutE1234.cls class file that defines a "custom" Device-Under-Test object that Implements the IDut Interface defined by Exec 202 is shown. The IDut interface includes all the properties that Exec 202 needs to document the DUT. This example extends the DUT class by adding several methods such as Range, StartMeasurement, and ReadMarkerMax.

TABLE 9

```
1  Implements ExecObjects.Idut
2  Private m_sAVID As String
3  Private m_sAddress As String
4  Private m_sComment As String
...Additional private variables for IDut interface not shown...
'--------------------------------------------------------
6  Public Property Let Range(ByVal NewRange As Double)
7     HpibWrite idDut, "INPUT:RANGE " & NewRange & "VP"
8  End Property
'--------------------------------------------------------
10 Public Sub StartMeasurement( )
11    HpibWrite idDut, "INIT:START"
12 End Sub12 End Property
'--------------------------------------------------------
```

TABLE 9-continued

14 Public Property Get ReadMarkerMax(ByVal ch As Integer) As Double
15    HpibWrite idDut, "MARK" & ch & ":MAX:Y?"
16    ReadMarkerMax = HpibRead(idDut)
17 End Property
...Many IDut Property Let and Property Get subs not shown...

As before, the line numbers are not part of the code, but are provided to reference the following explanatory notes:

Line 1: The Implements statement says that this class is derived from the IDut class defined by Exec.

Lines 2-4: These lines dimension some variables to support the properties required by Exec's IDut interface. By convention, they have a "m_" prefix because their scope is "module private". The variable m_sAddress is a string to store the address of the DUT. They are private because they are accessed through public properties, which are not discussed in detail herein.

Lines 6-17: These methods are an example of a method the developer can add to extend and customize the DUT class. These methods call HpibWrite, a developer-written sub, which we can assume, calls an I/O function. How these methods are used has been discussed above.

Figure 5:
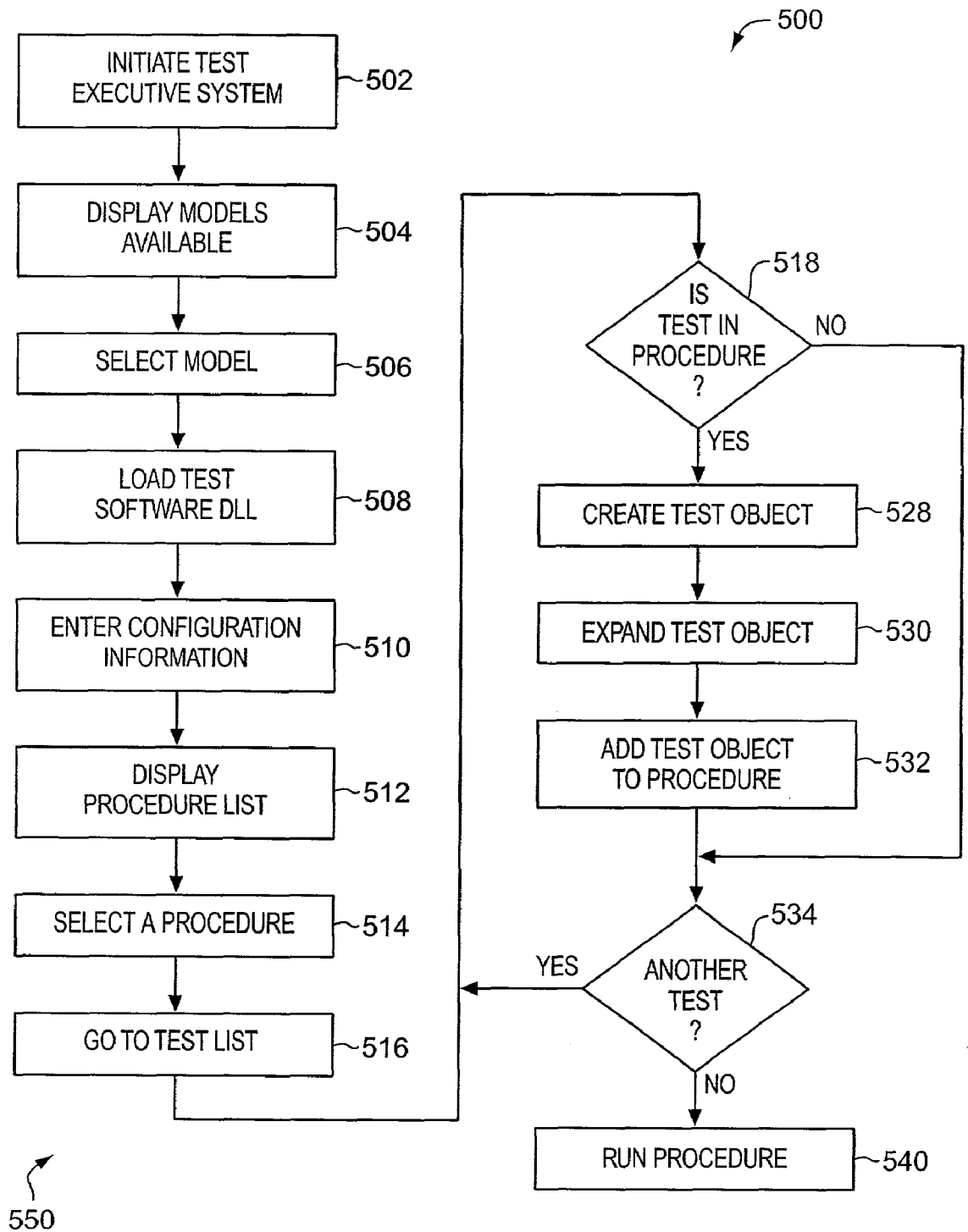
FIG. 5 is a flow chart of a preferred embodiment of a test executive program according to the invention.

Those skilled in the software art will be able to fully understand the invention from the above detailed example. For others, the invention is summarized in FIGS. 5 and 6. FIG. 5 is a generalized flow chart showing the key elements of the software method of the invention, and FIG. 6. is a generalized flow chart illustrating an exemplary test expansion process of the invention. At 502, the test executive system 100 is initiated. In general, there may be some general set up of the system during the initiation process. When the operator is ready to start a test, at 504, the operator activates a display indicating the various display models for which Test Software 206 is available, then at 506 selects one of the available models. The system 100 loads the test software object 206 in the form of a DLL. At this point, configuration information may be entered at 510. The operator may then activate a display of a procedure list at 512, though preferably this is done automatically by the system 100. The operator selects a procedure at 514, at which time the system enters a process 550 to expand the selected procedure. First, the test software enters a test loop at 516 and at 518 determines if the first test is in the selected procedure; if it is not, the program advances to 534, determines if there is another test on the test list, and, if there is, returns to 518. If a test is in the selected procedure, the system creates a test object at 528 and then expands the test object at 530. Method 530 will be explained in more detail below. The expanded test object is added to the procedure object at 532. The system cycles through the available tests until there are no more tests, at which point the procedure object is filled and the system proceeds to run the procedure at 540, unless otherwise directed by the operator. In running the procedure, test results are generated and a custom data structure is created in Exec 202 as the results are posted as shown in FIG. 4 and described above.

Figure 6:
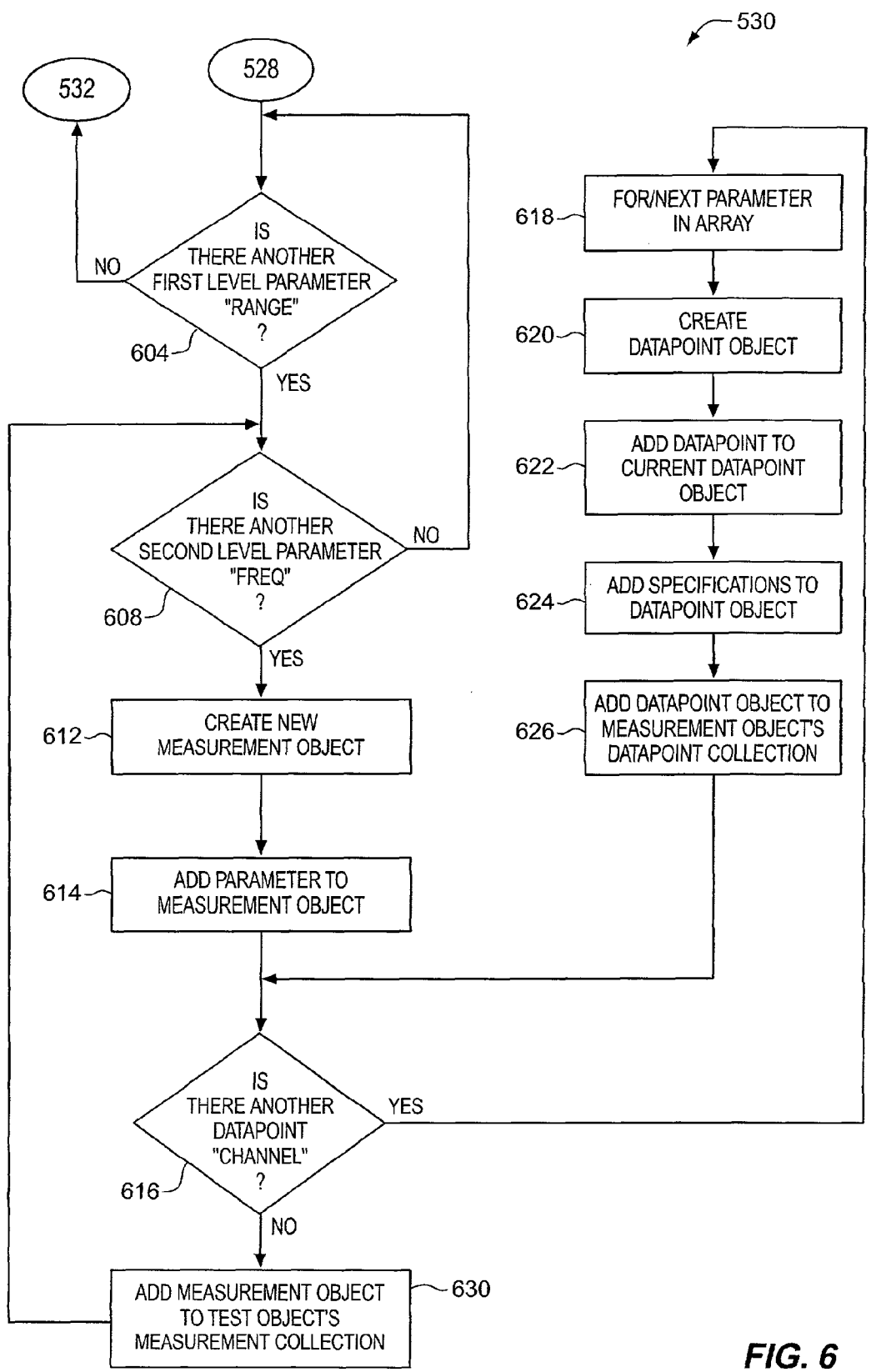
FIG. 6 is a flow chart of an exemplary embodiment of the Expand Test Object method of FIG. 5.

FIG. 6 is a flow chart of an exemplary expansion 530 of a Test that is part of a Procedure. This is given in terms of the above example in which there are two different types of parameters, Range and Frequency, with each Range parameter containing within it a plurality of Frequency parameters. In this example, the test expansion method 530 seeks 604 for a first level parameter object 320, which in the example above is one of several ranges. Because in this test the parameter range has within it several second level parameters frequency, the system enters an inner loop at 608. For each combination of range and frequency, it creates a measurement object at 612, and then adds the current parameters to the measurement object at 614. Since, in this example, there are several datapoint parameters 324, i.e., channels, for each measurement, the system then enters a datapoint loop at 616. In the datapoint loop, a datapoint object is created at 620, then the datapoint and specifications for the datapoint are added to the datapoint object at 622 and 624, respectively. The datapoint object is then added to the measurement object at 626, and the system goes to the next datapoint at 616. The datapoint loop is repeated until there are no more datapoints, which, for this example, will be three times, once for each of three channels. When all the datapoints have been processed, the system adds the measurement object to the test objects measurement collection at 630, and then goes to the next second level parameter at 608, creates another measurement object for that combination of range and frequency, repeats the datapoint loops, and adds the measurement object to the test objects collection for that combination. When all frequencies have been processed for a given range parameter, the range parameter is incremented at 604, and the system proceeds to create measurement objects and fills the measurement objects with datapoint objects as described above. When all first level parameters have been processed, the system recognizes this at 604 and proceeds to method 532 of FIG. 5.

Figure 7:
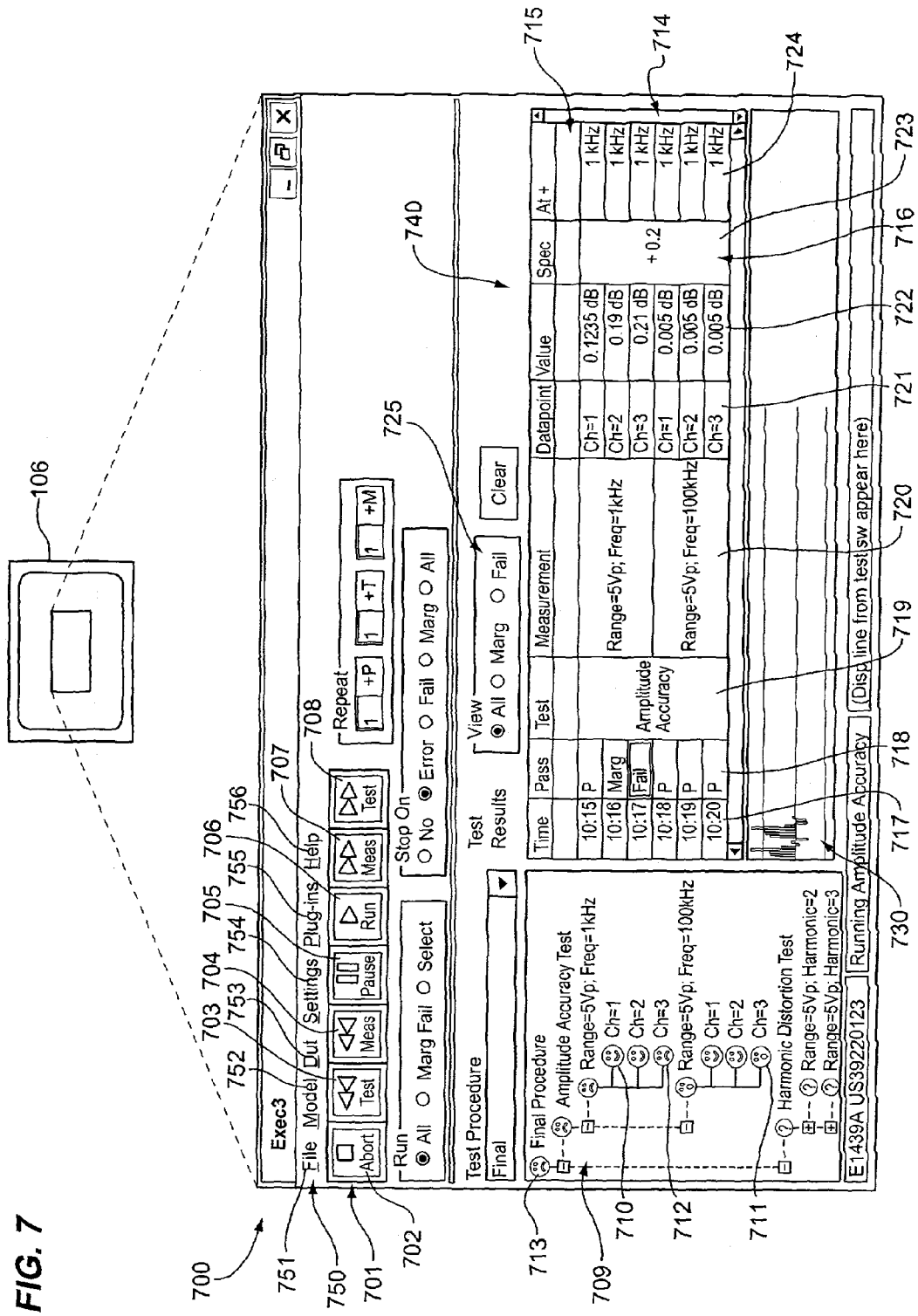
FIG. 7 illustrates an exemplary graphical user interface according to the invention showing two embodiments of a data structure generated by the invention.

All inputs and outputs of computer system 100 (FIG. 1) executing a test executive program are handled through a Graphical User Interface (GUI). FIG. 7 illustrates a GUI 700 as displayed by output device 106 in accordance with a test executive program 200 of this invention. In particular, it shows two embodiments of an exemplary data structure that typically may result from a run of the test software 206 of the above example. In one embodiment, the data structure is in the form of a table 714. In another embodiment, the data structure is in the form of a hierarchical tree 709. Both of these structures, as well as other features of the GUI 700 will be discussed below.

GUI 700 includes buttons 701 that are used to control a test. For the convenience of the user, buttons 701 have indicia that indicate the function served by a button and are styled as tape recorder type buttons in accordance with a preferred embodiment of this invention. In the preferred embodiment, these buttons include abort button 702, restart test button 703, restart measurement button 704, pause button 705, run button 706, skip measurement button 707, and skip test button 708. One skilled in the art will recognize that while tape recorder symbols are used in this embodiment, any number of different indicia may be used to identify buttons 701.

Area 714 on the right side of GUI 700 in the preferred embodiment is a tabular display of test results. In the preferred embodiment, data table 714 includes a series of rows 715 and columns 716 displaying results 740 of individual tests. Column 717 indicates the time that the test was executed for a particular datapoint. Column 718 displays a status of the test. Column 719 also displays a name of a test. For example, the test shown is the amplitude accuracy test described in detail above. Column 720 indicates the parameters of measurement being taken during a test. For example, range=5 Vp; frequency=1 kHz. Column 721 displays the datapoint under test, which, in this case, is a channel, for example, ch=1 or ch=2. Column 722 displays a value or result of the test for a datapoint. Column 723 displays a specification, such as +0.2. Column 724 displays a value of the parameter frequency, such as 1 kHz.

Buttons 725 facilitate the filtering of displayed test results to allow a user to view a portion of all test results. In the preferred embodiment, buttons 725 include an all button, a marginal pass button, and a fail button. However, one skilled in the art will recognize any number of additional ways to view the data may be added. Area 730 displays a progress bar that represents progress of a procedure being executed.

In the preferred embodiment, the left side of GUI 700 illustrates a data structure in the form of a tree 709 and includes a hierarchy of procedure, tests, measurements, and datapoints. Test tree 709 includes icons 713, 710, 711, 712 that indicate the status of a procedure, test, measurement, and datapoint, respectively. The icons indicate pass, fail, marginal, and not-yet tested. In a preferred embodiment, a "smiley face" indicates a pass, a "surprised face" indicates a marginal pass, and a "frowning face" indicates a fail. The icon 713 for the procedure indicates the status of the entire procedure. While icons for each test represent the status of an individual test, the icon for the procedure is determined by an algorithm that promotes the least optimal result. Thus, if one test fails, the procedure fails.

GUI 700 also includes a menu bar 750. Menu bar 750 displays a list of menu options for controlling the test executive program 200. Menu bar 750 includes file menu 751, model menu 752, DUT menu 753, setting menu 754, plug-in menu 755 and help menu 756. File menu 751 includes a list of options for opening and closing files for use with the test executive program. Model menu 752 displays a list of model families for which procedures are available. DUT menu 753 displays a screen for entry of a DUT model, serial number, options and other information for identifying a DUT. Settings menu 754 displays a menu for viewing and changing the test executive program settings. Plug-in menu 755 displays a user interface for a plug-in to which the system is interfaced. Help menu 756 displays a list of help functions available in the test executive program.

It should be understood that the example given above is only intended as an illustration of the invention, and is not intended to limit the invention. As discussed above, in the method of the invention, tests are parameter driven. That is, the form of any test is driven by the parameters that make up the test. For this reason, the system can best be explained in terms of specific parameters which make up a specific test. However, in general, it can be seen that the invention enters one or more measurement loops and, if necessary, one or more datapoint loops, to generate and fill the test object, which in turn will generate the custom data structure as the procedure is run. The number of measurement loops, and whether there are datapoint loops and the number of datapoint loops, are determined by the specific parameters that are measured in a specific test. This is what is meant by the statement that the tests are parameter driven.

From the above description, it can be seen that the system of the invention forces the test developer to analyze the device to be tested and organize the tests in a hierarchical fashion. However, that done, the return is large. Once the system of the invention is used for a short period time, it is recognized that the number of parameters that are used in testing various devices are much more limited in scope than the number of devices that exist. A collection of test, measurement and datapoint objects that make up procedures are rapidly accumulated, and thereafter, as new devices are developed, the procedures for the new devices can easily be constructed out of the accumulated collection of software objects.

A feature of the invention is that a test algorithm does not have to be laboriously constructed. The test algorithm falls out of the process of developing a test by combining various measurement and datapoint objects, and then expanding a procedure by expanding and combining tests. A related feature is that a data structure does not have to be separately constructed. Rather, the data structure is generated on the fly as the test is run.

It should be understood that the particular embodiments shown in the drawings and described within this specification are for purposes of example and should not be construed to limit the invention, which will be described in the claims below. Further, it is evident that those skilled in the art may now make numerous uses and modifications of the specific embodiments described, without departing from the inventive concepts. It is also evident that the methods recited may in many instances be performed in a different order; or equivalent structures and processes may be substituted for the various structures and processes described. Consequently, the invention is to be construed as embracing each and every novel feature and novel combination of features present in and/or possessed by the invention herein described.

I claim:

1. A method of operating a test executive system for electronically testing a device under test (DUT) that is separate and distinct from said test executive system, said method comprising:
   electronically storing a plurality of tests and a procedure, each test comprising software code defining a test algorithm and said procedure comprising data describing an ordered list of said tests;
   expanding said procedure by combining said software code of predetermined ones of said tests as determined by said ordered list to populate a test software object; and
   executing said software code of said test software object containing said predetermined ones of said tests expanded by said procedure on said DUT and generating a data structure comprising the results of said predetermined tests.

2. A method as in claim 1 wherein said procedure includes a list of one or more measurements, each of said one or more measurements comprise a configuration for a specified test, and said expanding comprises adding said one or more measurements in said list to a collection of measurements associated with said specified test.

3. A method as in claim 2 wherein each of said tests comprise a test object, said procedure comprises a procedure object, and each of said measurements comprises a measurement object, and each said measurement object passes test parameters to said test object.

4. A method as in claim 2 wherein said procedure includes a list of datapoints, each of said datapoints is associated with one of a plurality of results for a specified measurement, and said expanding comprises adding said datapoints to a collection of datapoints associated with said specified measurement.

5. A method as in claim 4 wherein each of said tests comprise a test object, said procedure comprises a procedure object, each of said measurements comprises a measurement object, and each of said datapoints comprises a datapoint object, and said expanding comprises: adding said datapoint object to a collection of datapoint objects associated with a specified measurement as determined by said procedure; adding said measurement object to a collection of measurement objects associated with a specified test as determined by said procedure, and adding said predetermined test objects to said procedure object.

6. A method as in claim 5 wherein said expanding further comprises creating one or more objects, wherein said one or more objects are selected from the group consisting of said test object, said measurement object, and said datapoint object.

7. A method as in claim 6 wherein said executing comprises looping through said tests, measurements and datapoints while generating said data structure comprising the results of said tests, measurements, and datapoints.

8. A method as in claim 1 wherein each of said tests and said procedure comprises a software object, and said expanding comprises adding said software object for each of said tests and said procedure to said test software object.

9. A method as in claim 8 wherein said expanding further comprises creating said test software object.

10. A method as in claim 1, and further comprising displaying a list of models available to be tested, receiving a selection of one of said models, and said storing comprises storing tests and a procedure associated with said selected model.

11. A method as in claim 10 wherein said storing comprises loading a DLL file associated with said selected model.

12. A method as in claim 11, and further comprising retrieving a list of available procedures from said DLL file, displaying said list, and receiving a selection of said procedure.

13. A method as in claim 1, and further comprising displaying a list of available procedures and receiving a selection of said procedure.

14. A test executive system for testing a device under test (DUT) that is separate and distinct from the test executive system, said system comprising:
an electronic memory storing a plurality of tests and a procedure, each test comprising software code defining a test algorithm and said procedure comprising data describing an ordered list of said tests;
a processor communicating with said memory for expanding said procedure by combining said software code of predetermined ones of said tests as determined by said ordered list to populate a test software object and executing said software code of said test software object containing said predetermined ones of said tests expanded by said procedure on said DUT to generate test results; and
a graphical user interface (GUI) communicating with said processor and including a data structure comprising said test results.

15. A test executive system as in claim 14 wherein said procedure includes a list of one or more measurements, each of said one or more measurements comprises a configuration for a specified test, and said processor adds said one or more measurements in said list to a collection of measurements associated with said specified test when expanding said procedure.

16. A test executive system as in claim 15 wherein said procedure includes a list of datapoints, each of said datapoints associated with one of a plurality of results for a specified measurement, and said processor adds said datapoints to a collection of datapoints associated with said specified measurement when expanding said procedure.

17. A test executive system as in claim 14 wherein said GUI further comprises a menu including list of models available to be tested.

18. A test executive system as in claim 14 wherein said memory stores a DLL file associated with a selected one of said models.

19. A test executive system as in claim 14 wherein said GUI includes a menu including a list of procedures available for a selected model.

20. A test executive system as in claim 14 wherein said data structure is a hierarchical tree.

21. A product that provides a test executive system for controlling tests upon a device under test (DUT) that is distinct and separate from said test executive system, said product comprising:
instructions for directing a processing unit to:
load into a memory a plurality of tests and a procedure, each of said tests comprising software code defining a test algorithm and said procedure comprising data describing an ordered list of said tests;
expand said procedure by combining said software code of predetermined ones of said tests as determined by said ordered list to populate a test software object;
execute said software code of said test software object containing said predetermined ones of said tests expanded by said procedure on said DUT and generate a data structure comprising the results of said predetermined tests; and
a media readable by said processing unit that stores said instructions.

22. A product as in claim 21 wherein said procedure includes a list of one or more measurements, each of said one or more measurements comprises a configuration for a specified test, and said instructions for directing said processing unit to expand said procedure further include instructions to add said one or more measurements in said list to a collection of measurements associated with said specified test.

23. A product as in claim 22 wherein said procedure includes a list of datapoints, each of said datapoints is associated with one of a plurality of results for a specified measurement, and said instructions for directing said processing unit to expand said procedure further include instructions to add said datapoints to a collection of datapoints associated with said specified measurement.

24. A product as in claim 23 wherein each of said tests comprise a test object, said procedure comprises a procedure object, each of said one or more measurements comprises a measurement object, and each of said datapoints comprises a datapoint object, and said instructions for directing said processing unit to expand said procedure further comprise instructions to: add said datapoint object to a collection of datapoint objects associated with a specified measurement as determined by said procedure; add said measurement object to a collection of measurement objects associated with a specified test as determined by said procedure; and add said predetermined test objects to said procedure object.

* * * * *